(12) United States Patent
Mizuta

(10) Patent No.: US 11,588,486 B1
(45) Date of Patent: Feb. 21, 2023

(54) BUS BUFFER CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masaru Mizuta, Kamakura Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 17/691,740

(22) Filed: Mar. 10, 2022

(30) Foreign Application Priority Data

Sep. 22, 2021 (JP) .............................. JP2021-154882

(51) Int. Cl.
*H03K 19/0175* (2006.01)
*H03K 19/094* (2006.01)
(Continued)

(52) U.S. Cl.
CPC ............. *H03K 19/094* (2013.01); *H03K 5/01* (2013.01); *H03K 19/21* (2013.01)

(58) Field of Classification Search
CPC ........... H03K 19/0002; H03K 19/0175; H03K 19/017509; H03K 19/017527;
(Continued)

(56) References Cited

U.S. PATENT DOCUMENTS 6,753,697 B2   6/2004  Nakase
9,755,644 B2   9/2017  Yamada

FOREIGN PATENT DOCUMENTS

JP    2003-229758 A    8/2003
JP    2009-117917 A    5/2009
JP    2017-069942 A    4/2017

*Primary Examiner* — Long Nguyen
(74) *Attorney, Agent, or Firm* — Kim & Stewart LLP

(57) ABSTRACT

According to one embodiment, a bus buffer circuit includes an input buffer circuit that receives an input signal, and outputs a non-inversion input signal and an inversion input signal, a voltage conversion circuit that operates by a second power supply, performs voltage conversion on the non-inversion input signal and the inversion input signal input thereto, and outputs the signals as a voltage-converted non-inversion output signal and a voltage-converted inversion output signal, an output retaining circuit that retains the voltage-converted non-inversion output signal and the voltage-converted inversion output signal at a same potential level when an output enable signal is in a disable state, a determinator that determines whether these signals are at a same potential level, a three-state output buffer circuit that outputs the voltage-converted non-inversion output signal or the voltage-converted inversion output signal from an output terminal, and an output controller that sets the three-state output buffer circuit in an output disable state, when the voltage-converted non-inversion output signal and the voltage-converted inversion output signal are at a same potential level, on a basis of an outcome of the determinator. Therefore, it is possible to prevent a potential different from the actual bus signal from being temporarily output during an output state transition, in a case where the state is fixed to reduce the power consumption.

14 Claims, 7 Drawing Sheets

(51) Int. Cl.
*H03K 19/21* (2006.01)
*H03K 5/01* (2006.01)

(58) Field of Classification Search
CPC ....... H03K 19/0185; H03K 19/018507; H03K 19/018514; H03K 19/018521; H03K 19/018528; H03K 19/02; H03K 19/173; H03K 19/1733; H03K 19/20; H03K 19/21; H03K 19/094; H03K 5/01
See application file for complete search history.

BUS BUFFER CIRCUIT

CROSS-REFERENCE TO RELATED APPLICATIONS

This application is based upon and claims the benefit of priority from Japanese Application No. 2021-154882, filed on Sep. 22, 2021, the entire contents of which are incorporated herein by reference.

FIELD

Embodiments described herein relate generally to a bus buffer circuit.

BACKGROUND

Conventionally, there is a bus buffer circuit as a circuit to be connected to the data bus.

In this bus buffer circuit, the output can be set in a high impedance state to prevent the nodes in the non-operating state from affecting the bus when a plurality of nodes are connected to the bus.

Further, a bus buffer circuit including a voltage conversion function is provided with a voltage conversion circuit that includes an ordinary input, an inversion input, an ordinary output, and an inversion output, and a three-state output buffer circuit.

Here, in order to reduce the current consumption during operation, when the internal circuit state is to be fixed, the state is fixed to retain the inversion relationship in potential between the ordinary output and the inversion output.

However, there is a case where a state-fixed internal signal is different in state from the actual bus input signal. Thus, when an output state transition is caused by an output control signal, there is a risk that a potential different from the actual bus signal would be temporarily output.

The present invention has been made in consideration of the above, and has an object to provide a bus buffer circuit that can prevent a potential different from the actual bus signal from being temporarily output during an output state transition.

DETAILED DESCRIPTION

According to one embodiment, a bus buffer circuit includes an input buffer circuit that operates by a first power supply, receives an input signal, and outputs a non-inversion input signal and an inversion input signal, a voltage conversion circuit that operates by a second power supply, performs voltage conversion on the non-inversion input signal and the inversion input signal input thereto, and outputs the signals as a voltage-converted non-inversion output signal and a voltage-converted inversion output signal, an output retaining circuit that retains the voltage-converted non-inversion output signal and the voltage-converted inversion output signal at a same potential level when an output enable signal is in a disable state, a determinator that determines whether the voltage-converted non-inversion output signal and the voltage-converted inversion output signal are at a same potential level, a three-state output buffer circuit that outputs the voltage-converted non-inversion output signal or the voltage-converted inversion output signal from an output terminal, and an output controller that sets the three-state output buffer circuit in an output disable state, when the voltage-converted non-inversion output signal and the voltage-converted inversion output signal are at a same potential level, on a basis of an outcome of the determinator.

Exemplary embodiments of a bus buffer circuit will be explained below in detail with reference to the accompanying drawings.

[1] First Embodiment

Figure 1:
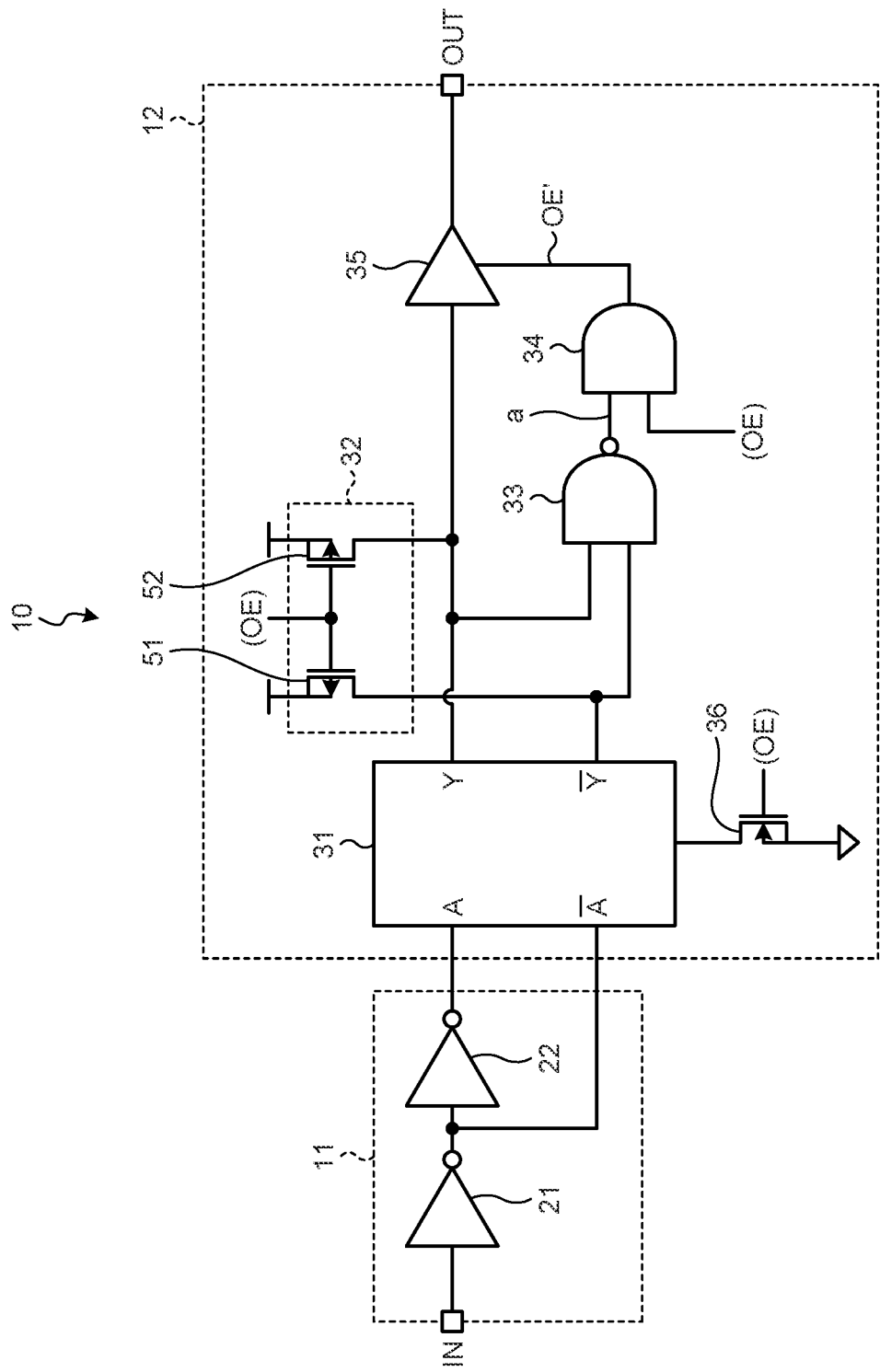
FIG. 1 is a schematic configuration block diagram of a bus buffer circuit according to a first embodiment.

FIG. 1 is a schematic configuration block diagram of a bus buffer circuit according to a first embodiment.

The bus buffer circuit 10 according to this embodiment includes an input buffer circuit 11 and an output buffer circuit 12. The input buffer circuit 11 operates by a first power supply, receives an input of an input signal IN, and outputs a non-inversion input signal IN and an inversion input signal /IN. The output buffer circuit 12 receives inputs of the non-inversion input signal IN and the inversion input signal /IN, operates by a second power supply to perform voltage conversion on the input signal IN, and outputs the signal as an output signal OUT.

The input buffer circuit 11 includes a first inverter 21 and a second inverter 22. The first inverter 21 receives an input of the input signal IN at the input terminal, inverts the input signal IN, and outputs the inversion input signal /IN from the output terminal. The second inverter 22 receives an input of the inversion input signal /IN at the input terminal, inverts the inversion input signal /IN, and outputs a non-inversion input signal IN from the output terminal.

The output buffer circuit 12 includes a voltage conversion circuit 31, an output retaining circuit 32, and a NAND circuit 33. The voltage conversion circuit 31 includes a non-inversion input terminal A, an inversion input terminal /A, a non-inversion output terminal Y, and an inversion output terminal /Y, performs voltage conversion on the non-inversion input signal IN input to the non-inversion input terminal A and the inversion input signal /IN input to the inversion input terminal /A, outputs a voltage-converted non-inversion output signal VOUT from the non-inversion output terminal Y, and outputs a voltage-converted inversion output signal /VOUT from the inversion output terminal /Y. The output retaining circuit 32 that retains the outputs of the voltage conversion circuit 31 at the same level ("H" level in the example of FIG. 1) when an output enable signal OE is in the output disable state. The NAND circuit 33 functions as a determinator that determines whether the non-inversion output and inversion output of the voltage conversion circuit 31 are at the same potential level.

Further, the output buffer circuit 12 includes an AND circuit 34, a three-state output buffer circuit 35, and an operation switch (N-channel MOS transistor) 36. The AND circuit 34 functions as an output controller that sets a control signal OE' in the disable state and thereby sets the three-state output buffer circuit 35 in the output disable state, when the non-inversion output and inversion output of the voltage conversion circuit 31 are at the same potential level, on the basis of the output of the NAND circuit 33. The three-state output buffer circuit 35 outputs a voltage-converted non-inversion signal VOUT as an output signal OUT when the input terminal is connected to the non-inversion output terminal Y and the control signal OE' is in the enable state.

Here, an explanation will be given of the configuration of the voltage conversion circuit.

Figure 2:
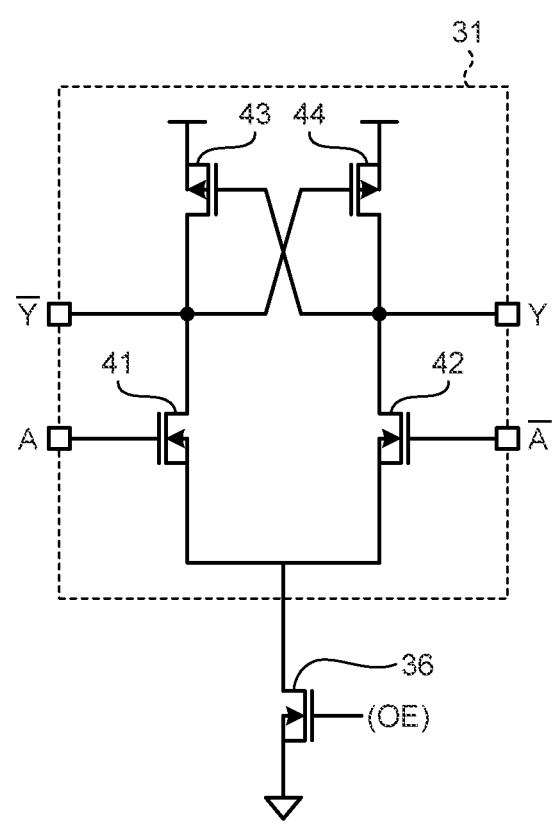
FIG. 2 is an explanatory diagram of a circuit configuration example of a voltage conversion circuit.

FIG. 2 is an explanatory diagram of a circuit configuration example of the voltage conversion circuit.

The voltage conversion circuit 31 includes an N-channel MOS transistor 41 and an N-channel MOS transistor 42. In the N-channel MOS transistor 41, the gate terminal is connected to the non-inversion input terminal A, the drain terminal is connected to the inversion output terminal, and the source terminal is connected to the low potential side power source of the second power supply (grounded in the example of FIG. 2). In the N-channel MOS transistor 42, the gate terminal is connected to the inversion input terminal /A, the drain terminal is connected to the non-inversion output terminal, and the source terminal is connected to the low potential side power source of the second power supply (grounded in the example of FIG. 2).

Further, the voltage conversion circuit 31 includes a P-channel MOS transistor 43 and a P-channel MOS transistor 44. In the P-channel MOS transistor 43, the gate terminal is connected to the non-inversion output terminal Y, the source terminal is connected to the high potential side power source of the second power supply, and the drain terminal is connected to the inversion output terminal /Y. In the P-channel MOS transistor 44, the gate terminal is connected to the inversion output terminal /Y, the source terminal is connected to the high potential side power source of the second power supply, and the drain terminal is connected to the non-inversion output terminal Y.

In the configuration described above, when the input signal IN is at an "H" level, the N-channel MOS transistor 41 is set in the ON-state (closed state). On the other hand, the N-channel MOS transistor 42 is set in the OFF-state (open state).

Consequently, the gate terminal of the P-channel MOS transistor 44 becomes an "L" level, and the P-channel MOS transistor 44 is set in the ON-state (closed state).

As a result, the non-inversion output terminal Y transitions to an "H" level.

Along with this, the gate terminal of the P-channel MOS transistor 43 becomes an "H" level, and the P-channel MOS transistor 43 is set in the OFF-state (open state).

Therefore, this sets the N-channel MOS transistor 41=ON-state, the N-channel MOS transistor 42=OFF-state, the P-channel MOS transistor 43=OFF-state, and the P-channel MOS transistor 44=ON-state, and thereby makes the non-inversion output terminal Y="H" level, and the inversion output terminal /Y to an "L" level. It follows that, while the logic of the non-inversion input signal IN and the inversion input signal /IN remains, a voltage-converted non-inversion output signal VOUT at an "H" level subjected to the voltage conversion is output from the non-inversion output terminal Y, and a voltage-converted inversion output signal /VOUT at an "L" level subjected to the voltage conversion is output from the inversion output terminal /Y.

Further, when the input signal IN is at an "L" level, the N-channel MOS transistor 41 is set in the OFF-state (open state). On the other hand, the N-channel MOS transistor 42 is set in the ON-state (closed state).

Consequently, the gate terminal of the P-channel MOS transistor 44 becomes an "H" level, and the P-channel MOS transistor 44 is set in the OFF-state (open state).

As a result, the non-inversion output terminal Y transitions to an "L" level.

Along with this, the gate terminal of the P-channel MOS transistor 43 becomes an "L" level, and the P-channel MOS transistor 43 is set in the ON-state (closed state).

Therefore, this sets the N-channel MOS transistor 41=OFF-state, the N-channel MOS transistor 42=ON-state, the P-channel MOS transistor 43=ON-state, and the P-channel MOS transistor 44=OFF-state, and thereby makes the non-inversion output terminal Y="L" level, and the inversion output terminal /Y to an "H" level. It follows that, while the logic of the non-inversion input signal IN and the inversion input signal /IN remains, a voltage-converted non-inversion output signal VOUT at an "L" level subjected to the voltage conversion is output from the non-inversion output terminal Y, and a voltage-converted inversion output signal /VOUT at an "H" level subjected to the voltage conversion is output from the inversion output terminal /Y.

Next, an explanation will be given of a configuration example of the output retaining circuit 32.

As illustrated in FIG. 1, the output retaining circuit 32 includes a pair of P-channel MOS transistors 51 and 52 whose gate terminals are commonly connected to each other and the output enable signal OE is input to the gate terminals.

Here, in the P-channel MOS transistor 51, the source terminal is connected to the high potential side power source of the second power supply, and the drain terminal is connected to the inversion output terminal /Y of the voltage conversion circuit 31.

On the other hand, in the P-channel MOS transistor 52, the source terminal is connected to the high potential side power source of the second power supply, and the drain terminal is connected to the non-inversion output terminal Y of the voltage conversion circuit 31.

As a result of the above configuration, when the output enable signal OE is in the disable state, that is, the output enable signal OE="L" level, the P-channel MOS transistors 51 and 52 are set in the ON-state (closed state), and the non-inversion output terminal Y and inversion output terminal /Y of the voltage conversion circuit 31 are put to the same level (in this case, "H" level).

Next, an explanation will be given of an operation according to the first embodiment.

Figure 3:
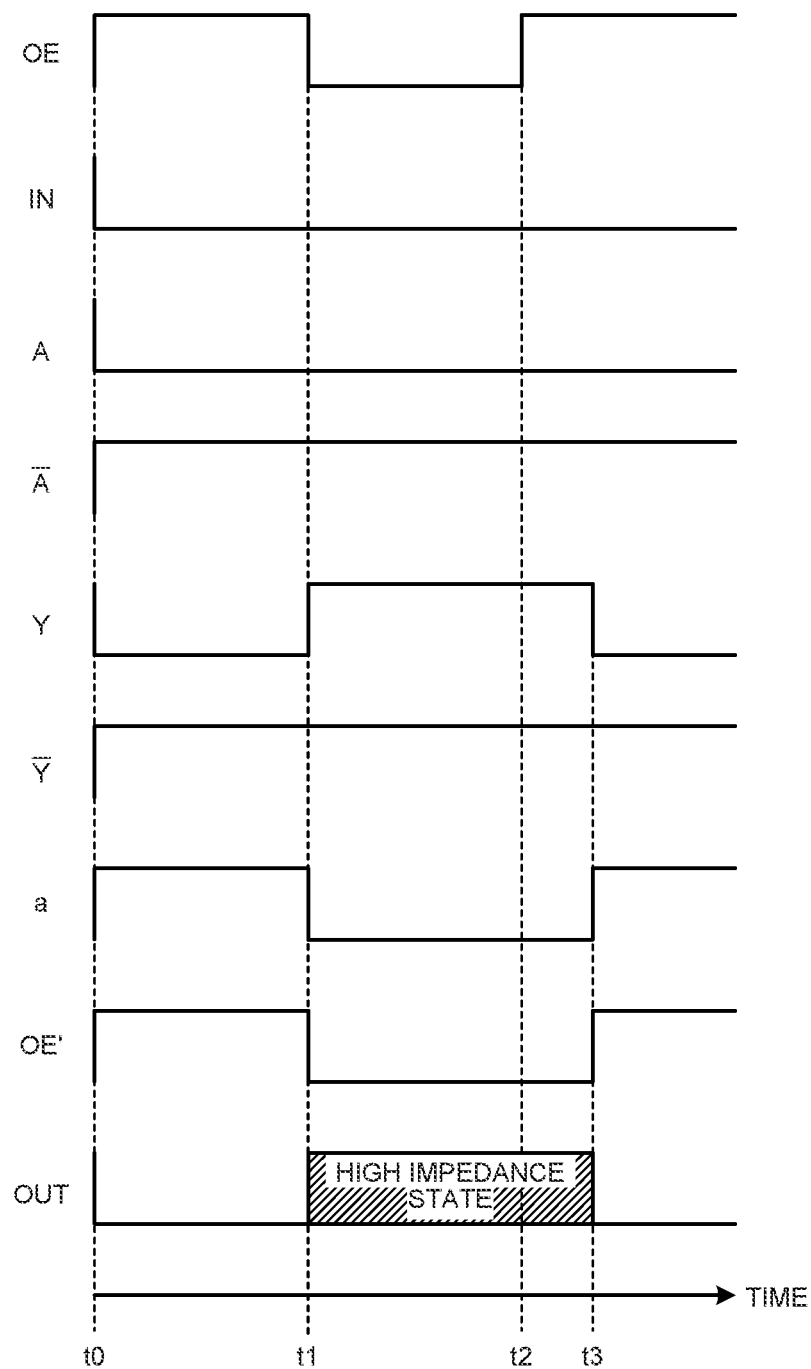
FIG. 3 is a timing chart according to the first embodiment.

FIG. 3 is a timing chart according to the first embodiment.

It is assumed that, at a time point t0, the output enable signal OE is in the enable state, that is, the output enable signal OE="H" level, and the input signal IN is at the "L" level.

Because of the input signal IN="L" level, in the period from the time point t0 to a time point t1 at which the output enable signal OE becomes the disable state, that is, the output enable signal OE="L" level, the voltage conversion circuit has the non-inversion input terminal A="L" level, the inversion input terminal /A="H" level, the non-inversion output terminal Y="L" level, and the inversion output terminal /Y="H" level.

As a result, since one input of the NAND circuit 33 is at the "H" level and the other input is at the "L" level, this makes a determination signal "a"="H" level, which is the output signal of the NAND circuit 33.

Further, since one input of the AND circuit 34 is the determination signal "a"="H" level and the other input is the output enable signal OE="H" level, the control signal OE' of the three-state output buffer circuit 35, which is the output signal of the AND circuit 34, is in the enable state at the "H" level.

Therefore, the three-state output buffer circuit 35 outputs, without any change, the output of the non-inversion output terminal Y input therein, and thus this output is at the "L" level.

After that, at the time point t1, when the output enable signal OE transitions to the disable state, that is, the output enable signal OE="L" level, the P-channel MOS transistors 51 and 52 of the output retaining circuit 32 are set in the ON-state (closed state), and the non-inversion output terminal Y and inversion output terminal /Y of the voltage conversion circuit 31 are put to the same level (in this case, "H" level).

As a result, since both of the inputs of the NAND circuit 33 are at the "H" level, this makes the determination signal "a"="L" level, which is the output signal of the NAND circuit 33.

Further, since one input of the AND circuit 34 is the determination signal "a"="L" level and the other input is the output enable signal OE="L" level, the control signal OE' of the three-state output buffer circuit 35, which is the output signal of the AND circuit 34, becomes the disable state at the "L" level.

Further, at a time point t2, the output enable signal OE becomes again the enable state, that is, the output enable signal OE="H" level, and new data is taken into the non-inversion input terminal A and the inversion input terminal /A.

However, in the period until a time point t3 when the signal input to the non-inversion input terminal A is propagated to the non-inversion output terminal Y, that is, in the period until a signal level transition at the non-inversion input terminal A appears as a signal level transition at the non-inversion output terminal Y, the non-inversion output is in a state where the non-inversion output terminal Y and the inversion output terminal /Y are retained at the same level ("H" level in the example of FIG. 1).

As a result, since both of the inputs of the NAND circuit 33 are at the "H" level, this makes the determination signal "a"="L" level, which is the output signal of the NAND circuit 33. Thus, the control signal OE' of the three-state output buffer circuit 35, which is the output signal of the AND circuit 34, is retained in the disabled state at the "L" level, and the output terminal OUT is retained in the high impedance state.

Then, at the time point t3 when the signal input to the non-inversion input terminal A is propagated to the non-inversion output terminal Y, the non-inversion output terminal Y becomes an "L" level.

As a result, since one input of the NAND circuit 33 is at the "L" level and the other input is at the "H" level, this makes the determination signal "a"="H" level, which is the output signal of the NAND circuit 33. Thus, the control signal OE' of the three-state output buffer circuit 35, which is the output signal of the AND circuit 34, becomes the enable state at the "H" level, and an "L" level signal is output from the output terminal OUT.

As described above, according to this first embodiment, even if it is tried to release the high impedance output state by the output enable signal OE serving as an output control signal, the high impedance state of the three-state output buffer 35 is retained in the period in which the non-inversion output terminal Y and the inversion output terminal /Y are at the same level due to the propagation delay. Accordingly, it is possible to reliably prevent the erroneous output.

[2] Second Embodiment

Figure 4:
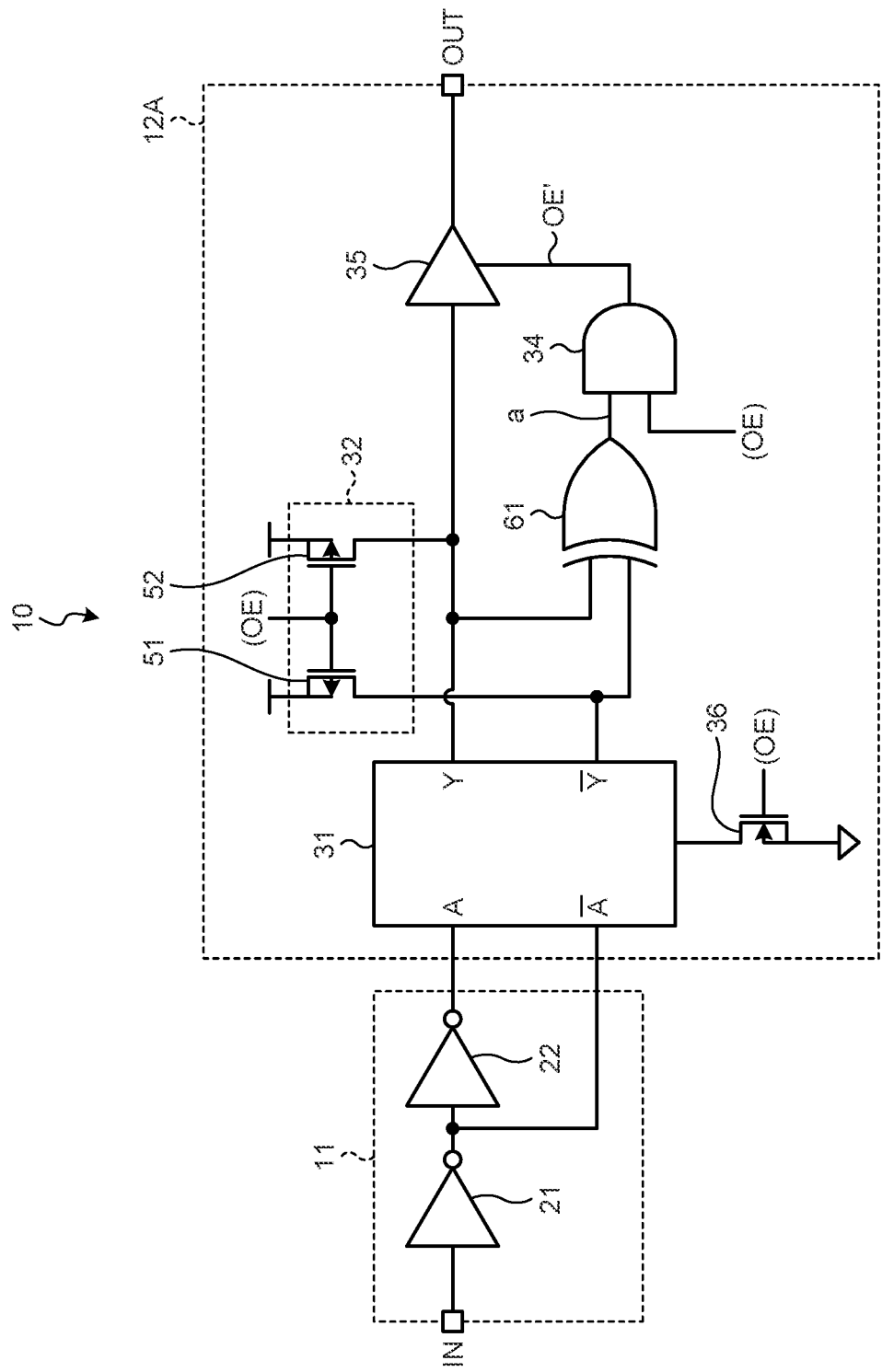
FIG. 4 is a schematic configuration block diagram of a bus buffer circuit according to a second embodiment.

FIG. 4 is a schematic configuration block diagram of a bus buffer circuit according to a second embodiment.

This second embodiment differs from the first embodiment, as follows. In the first embodiment described above, the NAND circuit 33 is provided functioning as a determinator that determines whether the non-inversion output and the inversion output are at the same potential level. In this second embodiment, instead of the NAND circuit 33, an output buffer circuit 12A is provided that includes an EXOR circuit 61 functioning as a determinator that determines whether the non-inversion output and the inversion output are at the same potential level.

Since the other configurations are substantially the same as those of the first embodiment, the corresponding descriptions made in the first embodiment will be invoked here, and additionally an operation of the output buffer circuit 12A will be described.

Then, an explanation will be given of an operation according to the second embodiment.

Since a timing chart according to the second embodiment is substantially the same as the timing chart according to the first embodiment, FIG. 3 will be referred to again for the explanation here.

It is assumed that, at a time point t0, the output enable signal OE is in the enable state, that is, the output enable signal OE="H" level, and the input signal IN is at the "L" level.

Because of the input signal IN="L" level, in the period from the time point t0 to a time point t1 at which the output enable signal OE becomes the disable state, that is, the output enable signal OE="L" level, the voltage conversion circuit has the non-inversion input terminal A="L" level, the inversion input terminal /A="H" level, the non-inversion output terminal Y="L" level, and the inversion output terminal /Y="H" level.

As a result, since one input of the EXOR circuit 61 is at the "H" level and the other input is at the "L" level, this makes a determination signal "a"="H" level, which is the output signal of the EXOR circuit 61.

Further, since one input of the AND circuit 34 is the determination signal "a"="H" level and the other input is the output enable signal OE="H" level, the control signal OE' of the three-state output buffer circuit 35, which is the output signal of the AND circuit 34, is in the enable state at the "H" level.

Therefore, the three-state output buffer circuit 35 outputs, without any change, the output of the non-inversion output terminal Y input therein, and thus this output is at the "L" level.

After that, at the time point t1, when the output enable signal OE transitions to the disable state, that is, the output enable signal OE="L" level, the P-channel MOS transistors 51 and 52 of the output retaining circuit 32 are set in the ON-state (closed state), and the non-inversion output terminal Y and inversion output terminal /Y of the voltage conversion circuit 31 are put to the same level (in this case, "H" level).

As a result, since both of the inputs of the EXOR circuit 61 are at the "H" level, this makes the determination signal "a"="L" level, which is the output signal of the EXOR circuit 61.

Further, since one input of the AND circuit 34 is the determination signal "a"="L" level and the other input is the output enable signal OE="L" level, the control signal OE' of the three-state output buffer circuit 35, which is the output signal of the AND circuit 34, becomes the disable state at the "L" level.

Further, at a time point t2, the output enable signal OE becomes again the enable state, that is, the output enable signal OE="H" level, and new data is taken into the non-inversion input terminal A and the inversion input terminal /A.

However, in the period until a time point t3 when the signal input to the non-inversion input terminal A is propagated to the non-inversion output terminal Y, the non-inversion output terminal Y and the inversion output terminal /Y are retained at the same level ("H" level in the example of FIG. 4).

As a result, since both of the inputs of the EXOR circuit 61 are at the "H" level, this makes the determination signal "a"="L" level, which is the output signal of the EXOR circuit 61. Thus, the control signal OE' of the three-state output buffer circuit 35, which is the output signal of the AND circuit 34, is retained in the disabled state at the "L" level, and the output terminal OUT is retained in the high impedance state.

Then, at the time point t3 when the signal input to the non-inversion input terminal A is propagated to the non-inversion output terminal Y, the non-inversion output terminal Y becomes an "L" level.

As a result, since one input of the EXOR circuit 61 is at the "L" level and the other input is at the "H" level, this makes the determination signal "a"="H" level, which is the output signal of the EXOR circuit 61. Thus, the control signal OE' of the three-state output buffer circuit 35, which is the output signal of the AND circuit 34, becomes the enable state at the "H" level, and an "L" level signal is output from the output terminal OUT.

As described above, according to this second embodiment, even if it is tried to release the high impedance output state by the output enable signal OE serving as an output control signal, the high impedance state of the three-state output buffer is retained in the period in which the non-inversion output terminal Y and the inversion output terminal /Y are at the same level due to the propagation delay. Accordingly, it is possible to reliably prevent the erroneous output.

[3] Third Embodiment

In the first embodiment and the second embodiment described above, when the output enable signal OE transitions to the disable state, that is, the output enable signal OE="L" level, the P-channel MOS transistors 51 and 52 of the output retaining circuit 32 are set in the ON-state (closed state), and both of the non-inversion output terminal Y and inversion output terminal /Y of the voltage conversion circuit 31 are set to an "H" level. On the other hand, this third embodiment is an embodiment in which both of the non-inversion output terminal Y and inversion output terminal /Y of the voltage conversion circuit 31 are set to an "L" level.

Figure 5:
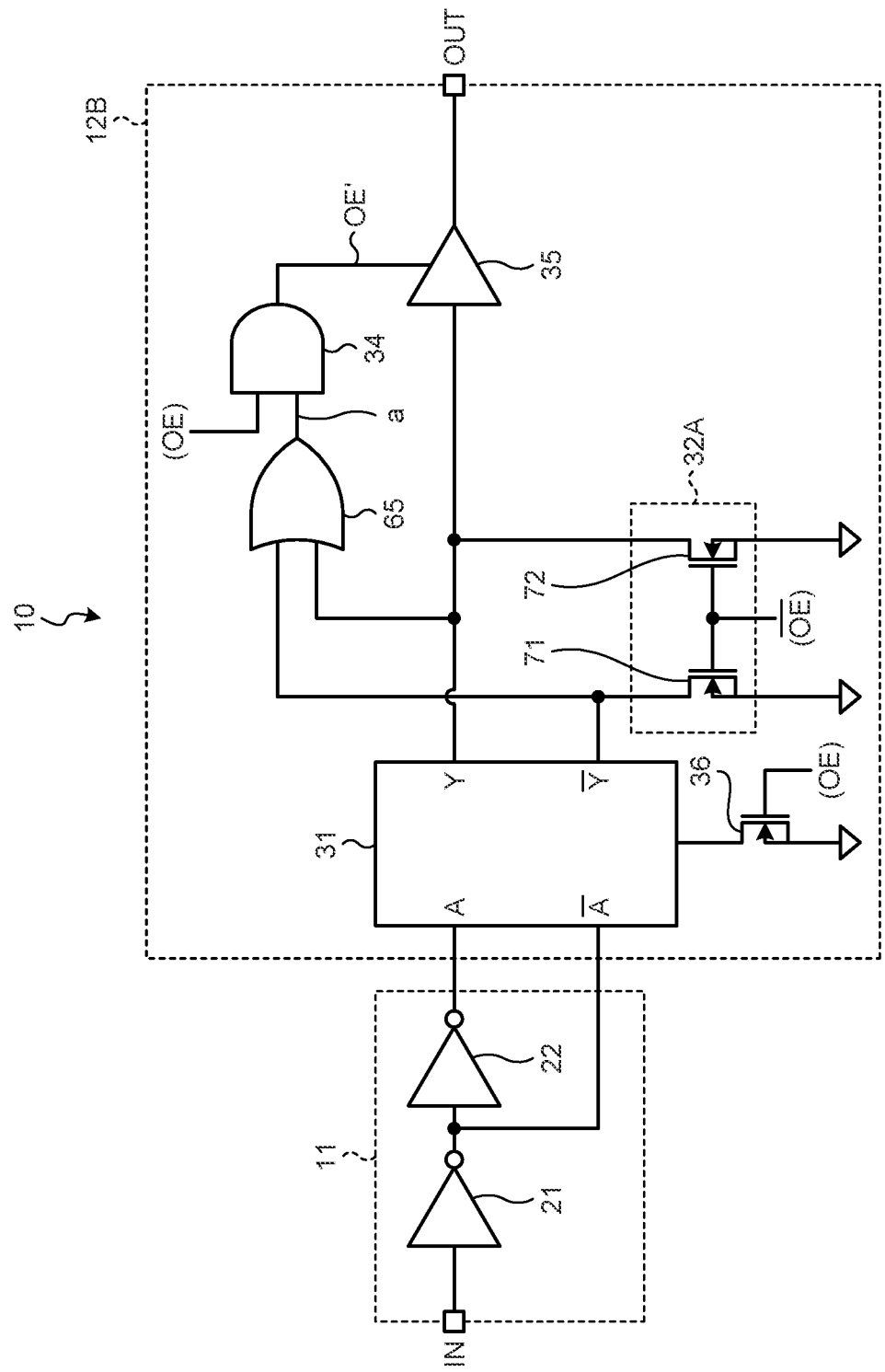
FIG. 5 is a schematic configuration block diagram of a bus buffer circuit according to a third embodiment.

FIG. 5 is a schematic configuration block diagram of a bus buffer circuit according to the third embodiment.

In this embodiment, since the configurations of the input buffer circuit 11, the voltage conversion circuit 31, the AND circuit 34, and the three-state output buffer circuit 35 are substantially the same as those of the first embodiment, their detailed descriptions made in the first embodiment will be invoked here.

The output buffer circuit 12B includes the voltage conversion circuit 31, an output retaining circuit 32A, an OR circuit 65, the AND circuit 34, and the three-state output buffer circuit 35. The output retaining circuit 32A functions as an output retaining circuit that retains the outputs of the voltage conversion circuit 31 at the same level ("L" level in the example of FIG. 5) when an output enable signal OE is in the output disable state. The OR circuit 65 functions as a determinator that determines whether the non-inversion output and inversion output of the voltage conversion circuit 31 are at the same potential level.

First, an explanation will be given of a configuration example of the output retaining circuit 32A.

As illustrated in FIG. 5, the output retaining circuit 32A includes a pair of N-channel MOS transistors 71 and 72 whose gate terminals are commonly connected to each other and an inversion output enable signal /OE, which is the inverted signal from the output enable signal OE, is input to the gate terminals.

Here, in the N-channel MOS transistor 71, the source terminal is connected to the low potential side power source of a second power supply (ground), and the drain terminal is connected to the inversion output terminal /Y of the voltage conversion circuit 31.

On the other hand, in the N-channel MOS transistor 72, the source terminal is connected to the low potential side power source of the second power supply (ground), and the drain terminal is connected to the non-inversion output terminal Y of the voltage conversion circuit 31.

As a result of the above configuration, when the output enable signal OE is in the disable state, that is, the output enable signal OE="L" level, that is, the inversion output enable signal /OE="H" level, the N-channel MOS transistors 71 and 72 are set in the ON-state (closed state), and the non-inversion output terminal Y and inversion output terminal /Y of the voltage conversion circuit 31 are put to the same level (in this case, "L" level).

Next, an explanation will be given of an operation according to the third embodiment.

Figure 6:
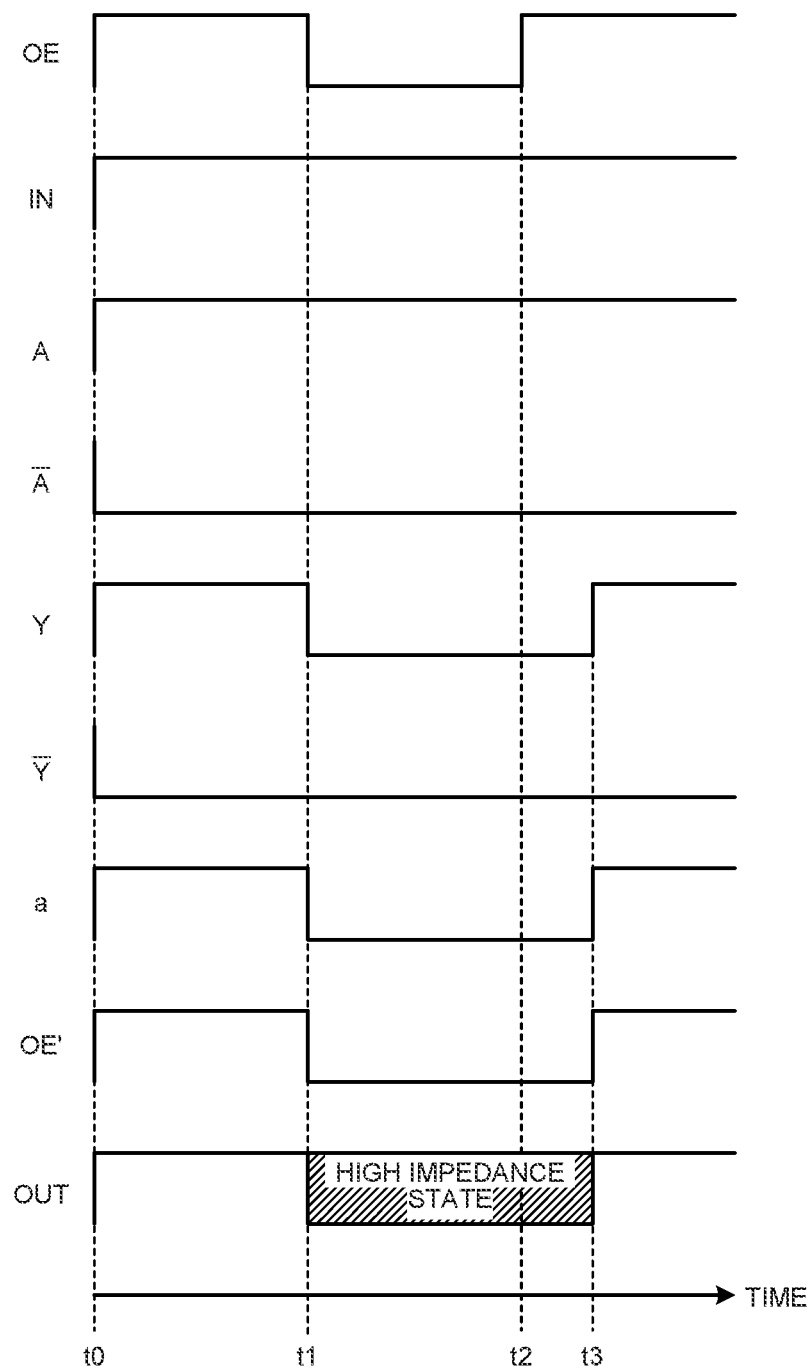
FIG. 6 is a timing chart according to the third embodiment.

FIG. 6 is a timing chart according to the third embodiment.

It is assumed that, at a time point t0, the output enable signal OE is in the enable state, that is, the output enable signal OE="H" level, and the input signal IN is at the "H" level.

Because of the input signal IN="H" level, in the period from the time point t0 to a time point t1 at which the output enable signal OE becomes the disable state, that is, the output enable signal OE="L" level, the voltage conversion circuit has the non-inversion input terminal A="H" level, the inversion input terminal /A="L" level, the non-inversion output terminal Y="H" level, and the inversion output terminal /Y="L" level.

As a result, since one input of the OR circuit 65 is at the "H" level and the other input is at the "L" level, this makes a determination signal "a"="H" level, which is the output signal of the OR circuit 65.

Further, since one input of the AND circuit 34 is the determination signal "a"="H" level and the other input is the output enable signal OE="H" level, the enable signal OE' of the output buffer circuit, which is the output signal of the AND circuit 34, is in the enable state at the "H" level.

Therefore, the output buffer circuit outputs, without any change, the output of the non-inversion output terminal Y input therein, and thus this output is at the "H" level.

After that, at the time point t1, when the output enable signal OE transitions to the disable state, that is, the output enable signal OE="L" level, since this causes a transition to the inversion output enable signal /OE="H" level, the N-channel MOS transistors 71 and 72 of the output retaining circuit 32A are set in the ON-state (closed state), and the non-inversion output terminal Y and inversion output terminal /Y of the voltage conversion circuit 31 are put to the same level (in this case, "L" level).

As a result, since both of the inputs of the OR circuit 65 are at the "L" level, this makes the determination signal "a"="L" level, which is the output signal of the OR circuit 65.

Further, since one input of the AND circuit 34 is the determination signal "a"="L" level and the other input is the output enable signal OE="L" level, the enable signal OE' of the output buffer circuit, which is the output signal of the AND circuit 34, becomes the disable state at the "L" level.

Further, at a time point t2, the output enable signal OE becomes again the enable state, that is, the output enable signal OE="H" level, and new data is taken into the non-inversion input terminal A and the inversion input terminal /A.

However, in the period until a time point t3 when the signal input to the non-inversion input terminal A is propagated to the non-inversion output terminal Y, the non-inversion output terminal Y and the inversion output terminal /Y are retained at the same level ("L" level in the example of FIG. 5).

As a result, since both of the inputs of the OR circuit 65 are at the "L" level, this makes the determination signal "a"="L" level, which is the output signal of the OR circuit 65. Thus, the enable signal OE' of the output buffer circuit, which is the output signal of the AND circuit 34, is retained in the disabled state at the "L" level, and the output terminal OUT is retained in the high impedance state.

Then, at the time point t3 when the signal input to the non-inversion input terminal A is propagated to the non-inversion output terminal Y, the non-inversion output terminal Y becomes an "H" level.

As a result, since one input of the OR circuit 65 is at the "L" level and the other input is at the "H" level, this makes the determination signal "a"="H" level, which is the output signal of the OR circuit 65. Thus, the enable signal OE' of the output buffer circuit, which is the output signal of the AND circuit 34, becomes the enable state at the "H" level, and an "H" level signal is output from the output terminal OUT.

As described above, according to this third embodiment, even if it is tried to release the high impedance output state by the output enable signal OE serving as an output control signal, the high impedance state of the three-state output buffer is retained in the period in which the non-inversion output terminal Y and the inversion output terminal /Y are at the same level due to the propagation delay. Accordingly, it is possible to reliably prevent the erroneous output.

[4] Fourth Embodiment

Figure 7:
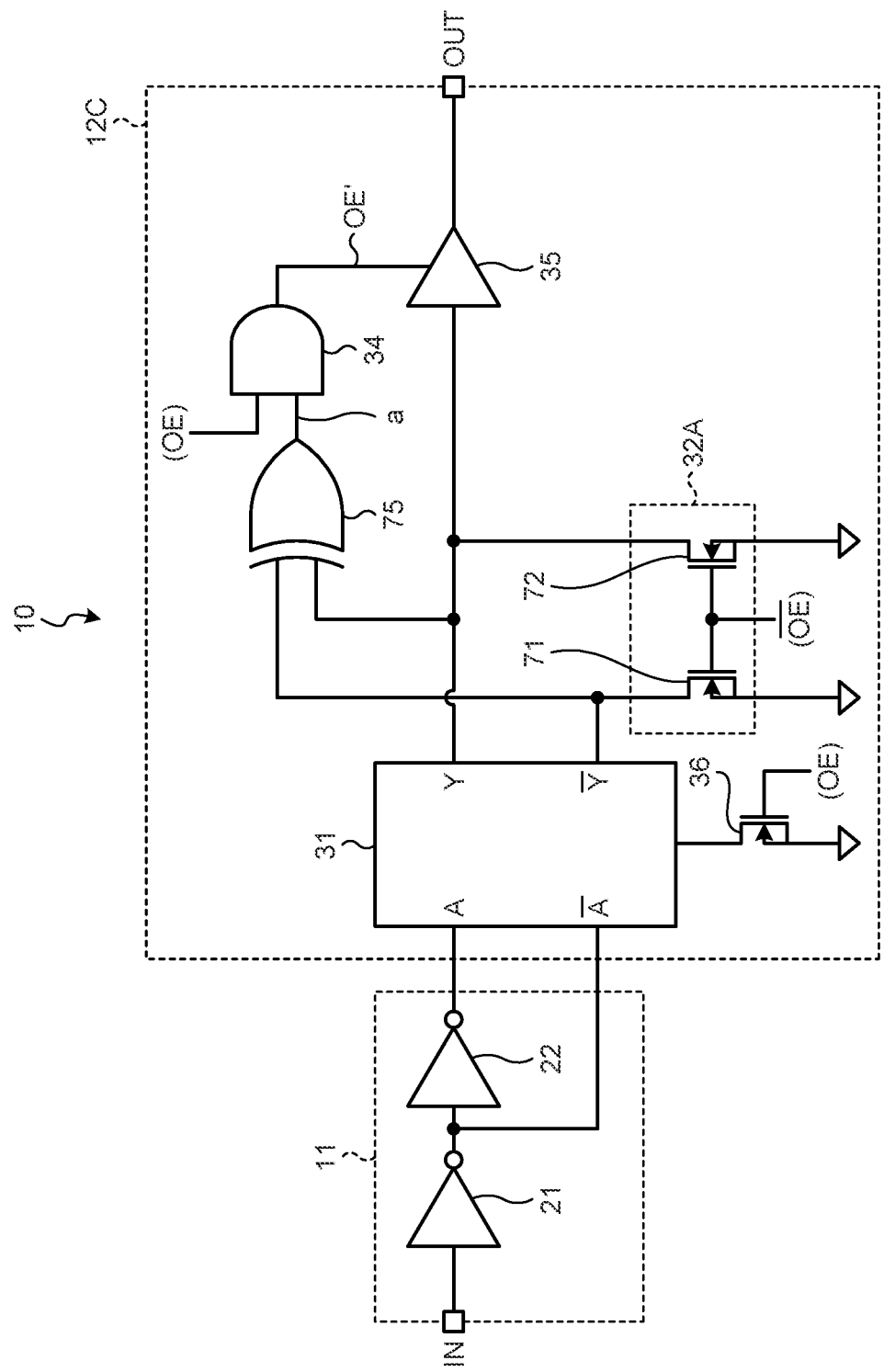
FIG. 7 is a schematic configuration block diagram of a bus buffer circuit according to a fourth embodiment.

FIG. 7 is a schematic configuration block diagram of a bus buffer circuit according to a fourth embodiment.

This fourth embodiment differs from the third embodiment, as follows. In the third embodiment described above, the OR circuit 65 is provided functioning as a determinator that determines whether the non-inversion output and the inversion output are at the same potential level. In this fourth embodiment, instead of the OR circuit 65, an output buffer circuit 12C is provided that includes an EXOR circuit 75 functioning as a determinator that determines whether the non-inversion output and the inversion output are at the same potential level.

Since the other configurations are substantially the same as those of the third embodiment, the corresponding descriptions made in the third embodiment will be invoked here, and additionally an operation of the output buffer circuit 12C will be described.

Then, an explanation will be given of an operation according to the fourth embodiment.

Since a timing chart according to the fourth embodiment is substantially the same as the timing chart according to the third embodiment, FIG. 6 will be referred to again for the explanation here.

It is assumed that, at a time point t0, the output enable signal OE is in the enable state, that is, the output enable signal OE="H" level, and the input signal IN is at the "H" level.

Because of the input signal IN="H" level, in the period from the time point t0 to a time point t1 at which the output enable signal OE becomes the disable state, that is, the output enable signal OE="H" level, the voltage conversion circuit has the non-inversion input terminal A="H" level, the inversion input terminal /A="L" level, the non-inversion output terminal Y="H" level, and the inversion output terminal /Y="L" level.

As a result, since one input of the EXOR circuit 75 is at the "H" level and the other input is at the "L" level, this makes a determination signal "a"="H" level, which is the output signal of the EXOR circuit 75.

Further, since one input of the AND circuit 34 is the determination signal "a"="H" level and the other input is the output enable signal OE="H" level, the control signal OE' of the three-state output buffer circuit 35, which is the output signal of the AND circuit 34, is in the enable state at the "H" level.

Therefore, the output buffer circuit outputs, without any change, the output of the non-inversion output terminal Y input therein, and thus this output is at the "H" level.

After that, at the time point t1, when the output enable signal OE transitions to the disable state, that is, the output enable signal OE="L" level, the N-channel MOS transistors 71 and 72 of the output retaining circuit 32 are set in the ON-state (closed state), and the non-inversion output terminal Y and inversion output terminal /Y of the voltage conversion circuit 31 are put to the same level (in this case, "L" level).

As a result, since both of the inputs of the EXOR circuit 75 are at the "L" level, this makes the determination signal "a"="L" level, which is the output signal of the EXOR circuit 75.

Further, since one input of the AND circuit 34 is the determination signal "a"="L" level and the other input is the output enable signal OE="L" level, the control signal OE' of the three-state output buffer circuit 35, which is the output signal of the AND circuit 34, becomes the disable state at the "L" level.

Further, at a time point t2, the output enable signal OE becomes again the enable state, that is, the output enable signal OE="H" level, and new data is taken into the non-inversion input terminal A and the inversion input terminal /A.

However, in the period until a time point t3 when the signal input to the non-inversion input terminal A is propagated to the non-inversion output terminal Y, the non-inversion output terminal Y and the inversion output terminal /Y are retained at the same level ("L" level in the example of FIG. 7).

As a result, since both of the inputs of the EXOR circuit 75 are at the "L" level, this makes the determination signal "a"="L" level, which is the output signal of the EXOR circuit 75. Thus, the control signal OE' of the three-state output buffer circuit 35, which is the output signal of the AND circuit 34, is retained in the disabled state at the "L" level, and the output terminal OUT is retained in the high impedance state.

Then, at the time point t3 when the signal input to the non-inversion input terminal A is propagated to the non-inversion output terminal Y, the non-inversion output terminal Y becomes an "H" level.

As a result, since one input of the EXOR circuit 75 is at the "L" level and the other input is at the "H" level, this makes the determination signal "a"="H" level, which is the output signal of the EXOR circuit 75. Thus, the control signal OE' of the three-state output buffer circuit 35, which is the output signal of the AND circuit 34, becomes the enable state at the "H" level, and an "H" level signal is output from the output terminal OUT.

As described above, according to this fourth embodiment, even if it is tried to release the high impedance output state by the output enable signal OE serving as an output control signal, the high impedance state of the three-state output buffer is retained in the period in which the non-inversion output terminal Y and the inversion output terminal /Y are at the same level due to the propagation delay. Accordingly, it is possible to reliably prevent the erroneous output.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in each of the embodiments described above, the explanations have been given of a case, as an example, where the three-state output buffer circuit 35 is configured to output a voltage-converted non-inversion output signal, which is the output signal of the non-inversion output terminal Y, from the output terminal OUT. However, the three-state output buffer circuit 35 may be configured with its input terminal connected to the inversion output terminal /Y so as to output a voltage-converted inversion output signal, which is the output signal of the inversion output terminal /Y, from the output terminal OUT.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A bus buffer circuit comprising:
an input buffer circuit that operates by a first power supply, receives an input of an input signal, and outputs a non-inversion input signal and an inversion input signal;
a voltage conversion circuit that operates by a second power supply, performs voltage conversion on the non-inversion input signal and the inversion input signal input thereto, and outputs these signals thus voltage-converted as a voltage-converted non-inversion output signal and a voltage-converted inversion output signal;
an output retaining circuit that retains the voltage-converted non-inversion output signal and the voltage-converted inversion output signal at a same potential level when an output enable signal is in a disable state;
a determinator that determines whether the voltage-converted non-inversion output signal and the voltage-converted inversion output signal are at a same potential level;
a three-state output buffer circuit that outputs the voltage-converted non-inversion output signal or the voltage-converted inversion output signal from an output terminal; and
an output controller that sets the three-state output buffer circuit in an output disable state, when the voltage-converted non-inversion output signal and the voltage-converted inversion output signal are at a same potential level, on a basis of an outcome of the determinator.

2. The bus buffer circuit according to claim 1, wherein the same potential level is either an "H" level or "L" level.

3. The bus buffer circuit according to claim 1, wherein the output retaining circuit sets the same potential level of the voltage-converted non-inversion output signal and the voltage-converted inversion output signal to an "H" level, and
the determinator is configured as a NAND circuit.

4. The bus buffer circuit according to claim 1, wherein the output retaining circuit sets the same potential level of the voltage-converted non-inversion output signal and the voltage-converted inversion output signal to an "H" level, and
the determinator is configured as an EXOR circuit.

5. The bus buffer circuit according to claim 1, wherein the output retaining circuit sets the same potential level of the voltage-converted non-inversion output signal and the voltage-converted inversion output signal to an "L" level, and
the determinator is configured as an OR circuit.

6. The bus buffer circuit according to claim 1, wherein the output retaining circuit sets the same potential level of the voltage-converted non-inversion output signal and the voltage-converted inversion output signal to an "L" level, and
the determinator is configured as an EXOR circuit.

7. The bus buffer circuit according to claim 3, wherein the output controller is configured as an AND circuit in which an output signal of the determinator is input to one input terminal and the output enable signal is input to another input terminal.

8. The bus buffer circuit according to claim 4, wherein the output controller is configured as an AND circuit in which an output signal of the determinator is input to one input terminal and the output enable signal is input to another input terminal.

9. The bus buffer circuit according to claim 5, wherein the output controller is configured as an AND circuit in which an output signal of the determinator is input to one input terminal and the output enable signal is input to another input terminal.

10. The bus buffer circuit according to claim 6, wherein the output controller is configured as an AND circuit in which an output signal of the determinator is input to one input terminal and the output enable signal is input to another input terminal.

11. The bus buffer circuit according to claim 3, wherein the output retaining circuit includes a pair of P-channel MOS transistors whose gate terminals are connected to each other, whose source terminals are connected to the second power supply, and whose drain terminals are connected to the determinator.

12. The bus buffer circuit according to claim 4, wherein the output retaining circuit includes a pair of P-channel MOS transistors whose gate terminals are connected to each other, whose source terminals are connected to the second power supply, and whose drain terminals are connected to the determinator.

13. The bus buffer circuit according to claim 5, wherein the output retaining circuit includes a pair of N-channel MOS transistors whose gate terminals are connected to each other, whose source terminals are connected to a ground, and whose drain terminals are connected to the determinator.

14. The bus buffer circuit according to claim 6, wherein the output retaining circuit includes a pair of N-channel MOS transistors whose gate terminals are connected to each other, whose source terminals are connected to a ground, and whose drain terminals are connected to the determinator.

* * * * *